(12) United States Patent
Butts et al.

(10) Patent No.: US 6,256,526 B1
(45) Date of Patent: Jul. 3, 2001

(54) METHODS FOR VIEW ANGLE TILT IMAGING OF INTERVENTIONAL DEVICES PROVIDING ADJUSTMENT OF DEVICE CONTRAST

(75) Inventors: Rosemary K. Butts; John M. Pauly, both of San Francisco, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/191,316

(22) Filed: Nov. 13, 1998

Related U.S. Application Data

(63) Continuation-in-part of application No. 08/946,544, filed on Oct. 7, 1997, now abandoned.

(51) Int. Cl.$^7$ .................................................. A61B 5/055
(52) U.S. Cl. ........................... 600/410; 324/307; 324/309
(58) Field of Search .......................... 600/410; 324/307, 324/309

(56) References Cited

U.S. PATENT DOCUMENTS

| | | | |
|---|---|---|---|
| 4,684,893 | * 8/1987 | Kojima et al. ....................... | 324/312 |
| 5,028,871 | * 7/1991 | Nakabayashi ....................... | 324/309 |
| 5,055,789 | * 10/1991 | Kondo et al. ....................... | 324/309 |
| 5,311,132 | * 5/1994 | Noll et al. ....................... | 324/309 |
| 5,331,552 | * 7/1994 | Lloyd et al. ....................... | 600/410 |
| 5,345,176 | * 9/1994 | Le Roux et al. ....................... | 324/309 |
| 5,351,006 | * 9/1994 | Sumanaweera et al. ....................... | 324/309 |
| 5,561,370 | * 10/1996 | Fuderer ....................... | 324/309 |
| 5,708,359 | * 1/1998 | Gregory et al. ....................... | 324/309 |
| 5,782,764 | * 7/1998 | Werne ....................... | 600/411 |
| 5,817,017 | * 10/1998 | Young et al. ....................... | 600/433 |
| 6,061,587 | * 5/2000 | Kucharczyk et al. ....................... | 600/411 |
| 6,150,815 | * 11/2000 | Janzen et al. ....................... | 324/309 |

OTHER PUBLICATIONS

McGowan, A.J., Reduction of Image Distortion in the Presence of Metal, 1997 Proceeding of the International Society of Magnetic Resonance in Medicine Annual Meeting, Vancouver Canada.

Cho, Z. et al., Total inhomogeneity correction including chemical shifts and susceptibility by view angle tilting, Med. Phys. 15(1), pp. 7–11, 1988.

Ro, Y. et al., A new frontier of blood imaging using susceptible effect and tailored RF pulses, Mag. Res. in Med. 28, pp. 237–248, 1992.

\* cited by examiner

Primary Examiner—Brian L. Casler
(74) Attorney, Agent, or Firm—Lumen Intellectual Property Services, Inc.

(57) ABSTRACT

The present invention provides methods for adjustment of contrast of magnetic susceptibility variations where the variations cause distortions which are removed by view angle tilting. Often, magnetic susceptibility variations are caused by devices such as needles inserted into a patient. In two methods of the present invention, first and second field gradients are applied simultaneous with excitation and refocusing gradients, respectively. The first and second gradients have different amplitudes or orientations, or both. This results in fewer spins rephasing in the vicinity of the susceptibility variation than elsewhere, thereby providing contrast. In another embodiment of the invention, a spin echo is produced, and the detection time of the spin echo signal is offset from the time of the spin echo. The offset results in a phase cancellation of spins near the susceptibility variation due to the relatively large range of magnetic field strengths. Other methods of the present invention are also disclosed.

9 Claims, 7 Drawing Sheets

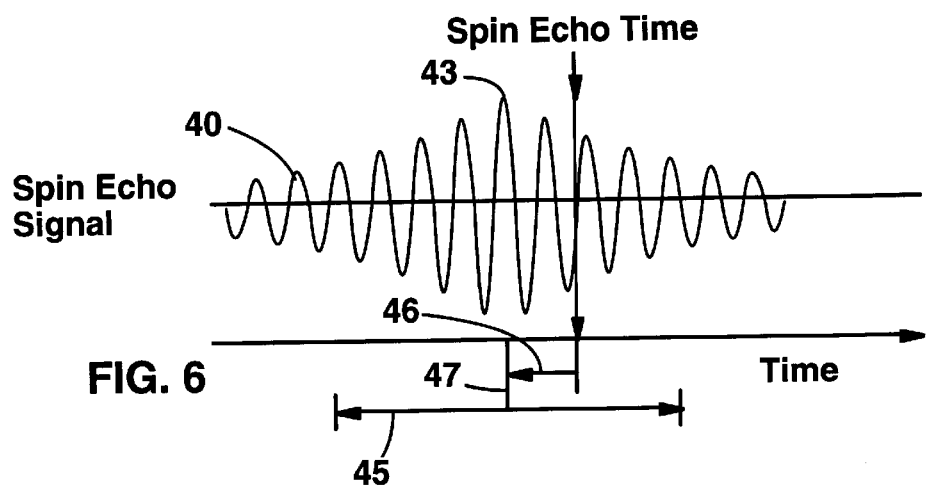
FIG. 6
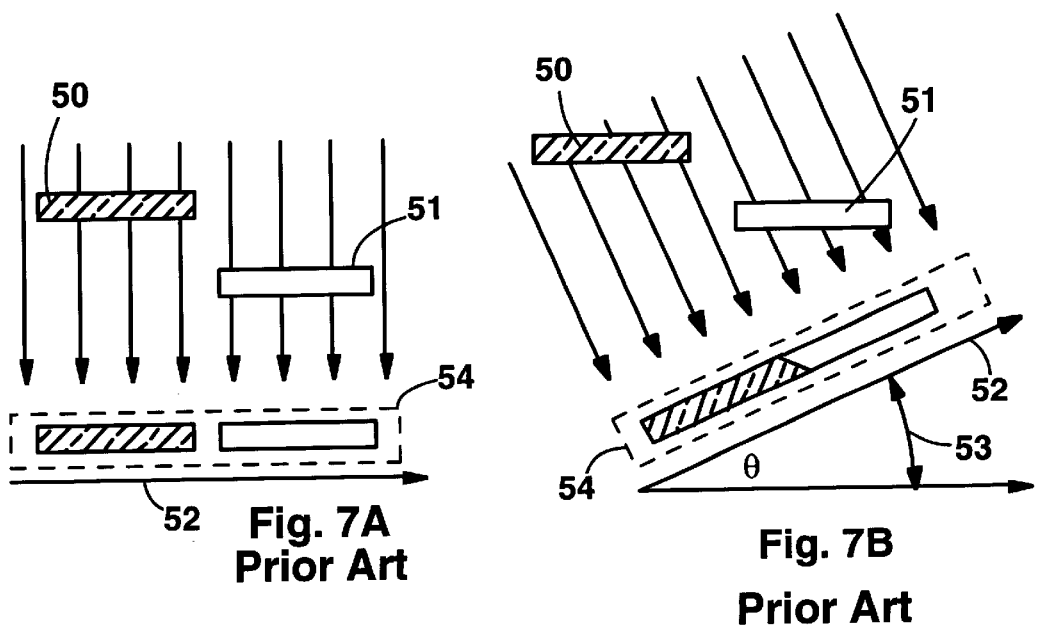
Fig. 7A
Prior Art
Fig. 7B
Prior Art

Flat Phase
Prior Art

Distorted Phase

Pure Quadratic Phase

Distorted+ Quadratic Phase

METHODS FOR VIEW ANGLE TILT IMAGING OF INTERVENTIONAL DEVICES PROVIDING ADJUSTMENT OF DEVICE CONTRAST

RELATED APPLICATIONS

The present application is a continuation-in-part of U.S. patent application Ser. No. 08/946,544, filed on Oct. 7, 1997 now abandoned.

FIELD OF THE INVENTION

This invention relates generally to magnetic resonance imaging techniques. More particularly, it relates to methods of imaging devices used in a patient during interventional magnetic resonance imaging procedures which allow independent adjustment of device contrast and tissue contrast.

BACKGROUND OF THE INVENTION

Magnetic resonance imaging is commonly used to image internal organs or the interior of a patient. MRI is performed by placing the object to be imaged in a highly uniform and strong (e.g. 1.5 Tesla) magnetic field. The magnetic field causes the atomic nuclei (which possess a magnetic moment) to become aligned with the magnetic field. The nuclei (spins) precess about the magnetic field direction at a rate which is proportional to the magnetic field strength. For hydrogen nuclei (commonly used as the diagnostic species in MRI) in a 1.5 Tesla magnetic field, the precession frequency is about 64 MHz.

In performing imaging, a magnetic field gradient is applied to the object simultaneously with an RF excitation pulse. The magnetic field gradient causes nuclei in different locations to precess at different frequencies (since the precession frequency is dependent upon magnetic field strength). The RF pulse has a well-defined frequency spectrum and polarization, and so causes nuclei having only certain precession frequencies (i.e. in certain locations) to become excited. The process is designed such that a rotating magnetic moment (localized within the volume of interest) is produced. The rotating magnetic moment provides a signal which is easily detectable with a nearby antenna. The entire process of applying gradients and RF pulses is repeated using a sequence of readout gradient encodings to collect a data set that can be reconstructed into an image.

MRI is helpful in guiding interventional devices such as needles into a patient. MRI enables the accurate positioning of the device. Such interventional devices often have a magnetic susceptibility which is different from the magnetic susceptibility of surrounding human tissue. Although usually very small (e.g. about 100 parts per million), this difference in magnetic susceptibility causes problems when performing MRI, which requires a highly uniform field. The interventional device causes the magnetic field to become distorted in magnitude (directional changes are negligible for MRI purposes).

Therefore, when imaging is performed, the resultant image is distorted in the vicinity of the interventional device. Large distortions make it difficult to properly locate an interventional device in a desired location.

One solution to the problem of interventional device imaging has been to make the interventional devices out of a material which has a magnetic susceptibility that closely matches that of human tissue (e.g. carbon fiber). An interventional device with such a magnetic susceptibility will not distort the magnetic field. However, interventional devices made of such materials typically do not work as well in performing their intended function (e.g. acquiring biopsy samples) as devices made of conventional materials.

Another proposed solution to interventional device distortions concentrated on changing the pulse sequence to achieve the best contrast between the device and patient. See Lewin, J. et al. "Needle Localization in MR-Guided Biopsy and Aspiration: Effects of Field Strength, Sequence Design, and Magnetic Field Orientation" in *American Journal of Roentgenology*, vol. 166, pgs. 1337–1345, 1996, and "Interactive MR-Guided Breast Lesion Localization-A Phantom Study" by B. Daniel in *Proc., International Society for Magnetic Resonance in Medicine*, New York, 1996, pg. 1733. A problem with these techniques is that the tissue-tissue contrast and the device-tissue contrast are not both optimized in the same pulse sequence.

Total inhomogeneity correction including chemical shifts and susceptibility by view angle tilting, by Z. H. Cho, D. J. Kim, and Y. K. Kim, in *Med. Phys.* 15(1) January/February 1988, discloses a successful technique for removing the distortions caused by variations in magnetic susceptibility. The method includes the step of applying an additional magnetic field gradient during readout of MR signals to change the angle of MR data readout. This angular tilt corrects for displacements and distortions caused by local variations in magnetic field strength. Reduction of image distortion in the presence of metal, by A. J. McGowan, A. L. Mackay, Q. S. Xiang, D. G. Connell, D. L. Janzen, and P. L. Munk, in the 1997 *Proceedings of the International Society of magnetic Resonance in Medicine* annual meeting, Vancouver, Canada, Abstract #1973 discloses that the method of view angle tilting can be used to reduce or eliminate distortions caused by metal objects (e.g. a hip joint replacement) in human tissue.

A problem with removing magnetic susceptibility distortions by means of view-angle tilting is that the distortions are often removed completely, rendering the device nearly invisible. This is undesirable because it is often useful to see the device so that it can be guided into its proper location (e.g. when taking a biopsy tissue sample). Imaging parameters such as gradient echo imaging or spin echo imaging may be adjusted to increase the device-tissue contrast so that the device may be seen, but this often precludes the use of parameters which are optimized for tissue-tissue contrast.

Therefore, it would be an advance in the art of magnetic resonance imaging to provide a method of using view angle tilting which allows independent control of device-tissue contrast and tissue-tissue contrast.

OBJECTS AND ADVANTAGES OF THE INVENTION

Accordingly, it is a primary object of the present invention to provide a method for magnetic resonance imaging of interventional devices which 1) allows adjustment of device-tissue contrast independent of adjustment of tissue contrast.

SUMMARY OF THE INVENTION

This object and advantage is attained by six embodiments of the present invention in which view angle tilt magnetic resonance imaging is used to image an object (e.g. a patient) having a localized magnetic susceptibility variation (e.g. due to an interventional device).

In a first embodiment of the present invention, a method is provided in which an excitation RF pulse and a first field gradient is applied to the object to select a slice. Then, a refocusing RF pulse and a second field gradient are applied to refocus the slice. The first field gradient and second field gradient have different amplitudes. Also, the excitation pulse and refocusing pulse have different bandwidths such that the excitation profile and refocusing profile are overlapping in a region outside the magnetic susceptibility variation. Finally, a tilted readout field gradient is applied to the object. The excitation profile and refocusing profile are overlapping outside the magnetic susceptibility variation, and only partially overlapping or not overlapping in the region of the magnetic susceptibility variation. Preferably, the excitation profile and refocusing profile have the same thickness and location (i.e. completely overlap one another) in regions outside the magnetic susceptibility variation. The difference in gradient amplitudes determines the magnetic susceptibility contrast.

In a second embodiment of the present invention, an excitation pulse and first field gradient are applied to the object, thereby selecting a slice. Then, a refocusing pulse and second field gradient are applied to the object, thereby refocusing the slice. Finally, a tilted readout field gradient is applied to the object. The second field gradient has a direction opposite the first field gradient. The excitation profile and refocusing profile are overlapping outside the magnetic susceptibility variation, and only partially overlapping or not overlapping in the region near the magnetic susceptibility variation. The first and second gradients may have the same or different amplitudes. Preferably, the excitation profile and refocusing profile have the same thickness and location (i.e. completely overlap one another) in regions outside the magnetic susceptibility variation. The difference in gradient amplitudes determines the magnetic susceptibility contrast.

In a third embodiment of the present invention, RF pulses and field gradients are applied to the object such that a spin echo is produced from a localized volume of interest. The spin echo MR signal is detected during a detection time which is offset from the spin echo time. This results in a dephasing of the nuclear spins within the region of the magnetic susceptibility variation, and a corresponding loss of MR signal from this region. The amount of offset determines the magnetic susceptibility contrast.

In a fourth embodiment of the present invention, the method of view angle tilting is used wherein the tilt angle of the readout gradient is selected to provide incomplete reduction of the image distortion produced by the magnetic susceptibility variation. The tilt angle determines the magnetic susceptibility contrast.

In a fifth embodiment of the present invention, a single excitation pulse is applied simultaneously with a first field gradient. Then, a tilted readout gradient is applied. Preferably, the excitation pulse has a nonlinear phase profile. Most preferably, the excitation pulse has a quadratic phase profile. The amplitude of the nonlinear component of the excitation pulse determines the magnetic susceptibility contrast.

In a sixth embodiment of the present invention, a RF half pulse is applied simultaneously with a first field gradient. Then, the first field gradient and RF half pulse are rapidly turned off and the resulting signal is detected after waiting an interval time (i.e. an echo time) after the termination of the RF half pulse and field gradient. The length of the interval time determines the magnetic susceptibility contrast.

DESCRIPTION OF THE FIGURES

FIG. 6 illustrates method C of the present invention.

FIGS. 7A–7B (Prior Art) illustrate methods of view angle tilting.

DETAILED DESCRIPTION

In all the embodiments of the present invention, the method of view angle tilting is used to reduce or eliminate distortions caused by localized magnetic susceptibility variations. For more information concerning view angle tilting reference can be made to Total Inhomogeneity Correction Including Chemical Shifts and Susceptibility by View Angle Tilting, by Z. H. Cho, D. J. Kim, and Y. K. Kim, in *Med. Phys.* 15(1) January/February 1988.

Figure 1:
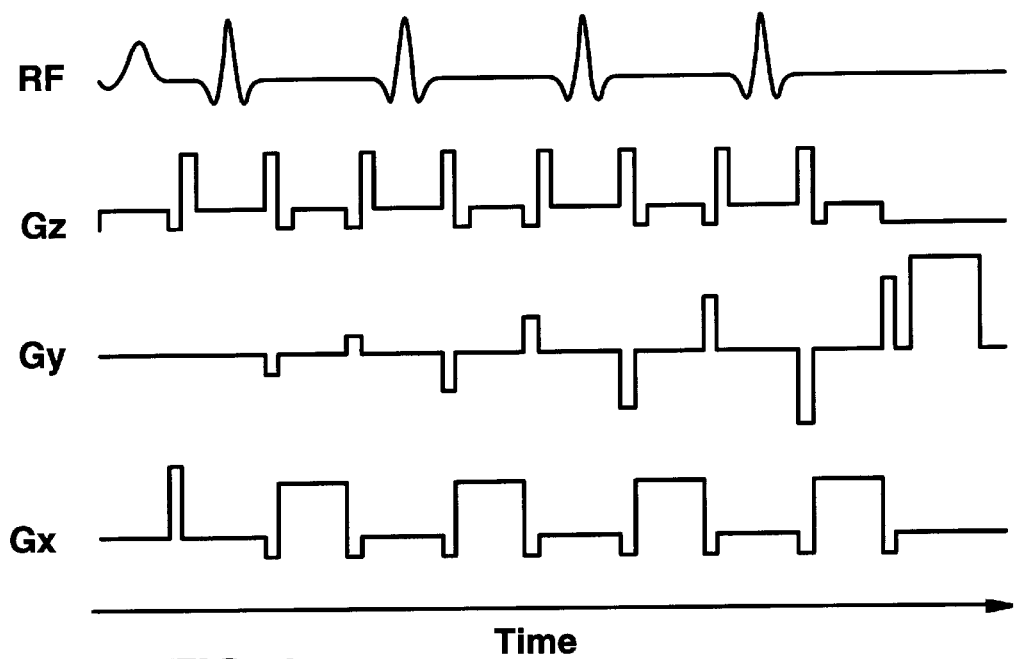
FIG. 1 (Prior Art) shows a pulse sequence which uses a tilted view angle.

FIG. 1 shows a rapid acquisition and relaxation enhancement (RARE) pulse sequence with view angle tilting applied. In methods A, B, C, and D of the present invention it is preferred to use a RARE pulse sequence. However, other pulse sequences besides RARE sequences (e.g. spin echo sequences) can also be used with the present invention.

Figure 2:
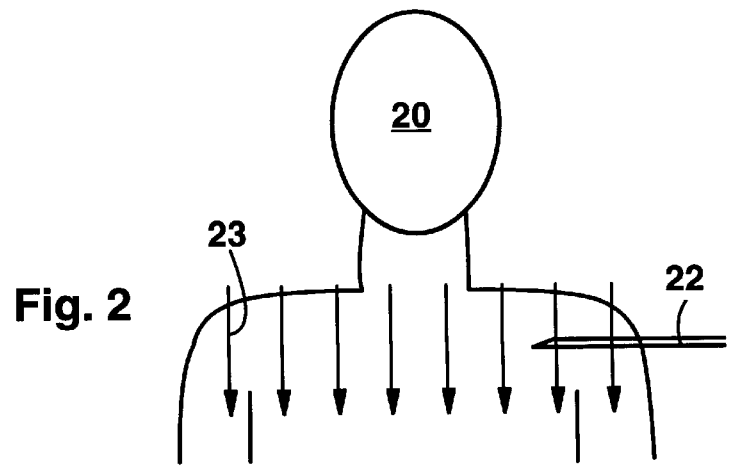
FIG. 2 shows a patient with an inserted biopsy needle that can be imaged according to the present invention.

FIG. 2 shows a typical situation in magnetic resonance imaging (MRI) in which a magnetic susceptibility variation is present in an object to be imaged. A patient 20 has an interventional device 22 such as a biopsy needle inserted. The device 22 has a magnetic susceptibility which is different from the magnetic susceptibility of the tissues of the patient 20. The device may be a metal biopsy needle and may be made of Iconel or titanium, for example. In performing magnetic resonance imaging on the patient 20 and device 22, a strong, uniform magnetic field 23 is applied to all areas to be imaged.

Figure 3:
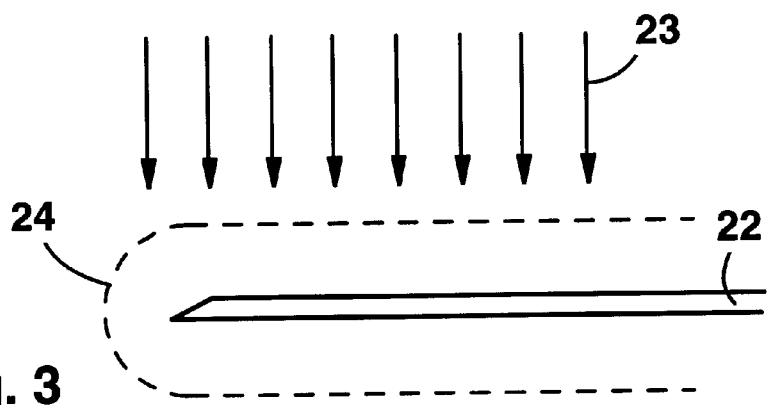
FIG. 3 shows a closeup of the biopsy needle of FIG. 1.

FIG. 3 shows a closeup of the biopsy needle and the applied magnetic field 23. A region 24 around the device 22 has a perturbed magnetic field due to the difference in magnetic susceptibility between the device 22 and patient 20. Region 24 may have both areas of increased magnetic field strength and areas of decreased magnetic field strength.

The region 24 of perturbed magnetic field causes MR images to be distorted in the vicinity of the device 22 (i.e. within region 24). View angle tilting corrects for these distortions. However, view angle tilting often corrects for the distortions so completely that the device 22 cannot be seen in the MRI image. The present invention provides methods for providing contrast between the device 22 (interventional device) and patient 20. More generally, the present invention provides methods for providing adjustable contrast of variations in magnetic susceptibility. This contrast is provided without interfering with conventional contrast techniques which are used to adjust tissue-tissue contrast between the different tissues within the patient 20.

The methods of the present invention allow the contrast between the interventional device 22 and patient to be adjustably controlled. Control over device-tissue contrast according to the present invention is independent of control over tissue—tissue contrast. There exist in the art many methods of providing tissue-tissue contrast. Therefore, the present invention can be used with many different methods for providing adjustable control over tissue-tissue contrast.

Figure 4:
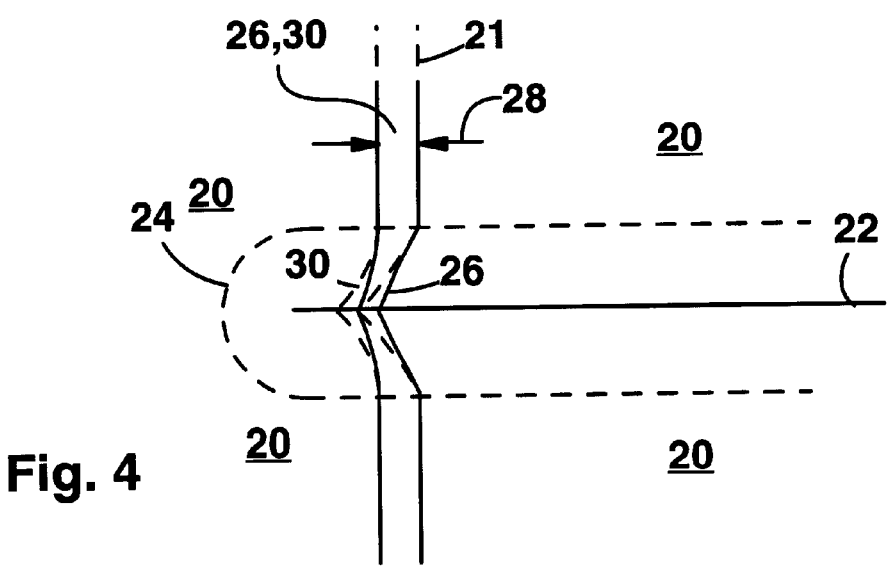
FIG. 4 illustrates method A of the present invention and shows the excitation profile and refocusing profile.

FIG. 4 illustrates a first embodiment (method A) of the present invention. An excitation radio-frequency (RF) pulse and first field gradient are applied to the patient 20 to select a slice 21 having an excitation profile 26. The excitation profile 26 is distorted in the region 24. Preferably, the excitation profile 26 is flat and planar with a well-defined thickness 28 outside the region 24. The distortion of the excitation profile 26 within the region 24 is caused by the distortion of the magnetic field 23 which is due to the magnetic susceptibility variation between the device 22 and patient 20.

In FIG. 3, the field gradient is parallel with the device 22. However, the gradient can also be perpendicular to the device 22, or have any other orientation with respect to device 22. The methods of the present invention work for any orientation of the device compared to the field gradients used.

Next, a refocusing RF pulse and a second field gradient are applied to the patient 20 and device 22 to refocus the slice 21. The second field gradient has an amplitude (Tesla per meter) which is different from the amplitude of the first field gradient. Also, the refocusing RF pulse has a bandwidth which is different from the bandwidth of the excitation RF pulse. The amplitudes (of first and second field gradients) and bandwidths (of excitation and refocusing RF pulses) are all selected such that excitation profile 26 and a refocusing profile 30 have the same thickness 28 and location (i.e. are substantially 100% overlapping) outside the region 24. Inside region 24, however, excitation profile 26 and refocusing profile 30 are substantially less than 100% overlapping. The difference in overlap is caused by the difference between first and second gradients, which produce different fields at device 22, and therefore distort the magnetic field differently. The difference in overlap of the two profiles (26 and 30) provides contrast between region 24 and the area outside region 24 (where 25 the magnetic field is unperturbed). It is noted that profiles 26, 30 may be less than 100% overlapping outside region 24. The present invention requires only that a difference in percentage of profile overlap exists inside and outside region 24.

In method A of the present invention, adjustment of contrast between device 22 and patient 20 is provided by adjusting the difference in magnitude between the first field gradient and second field gradient. A large difference between the first and second field gradients produces high contrast between the device 22 and patient.

Figure 5:
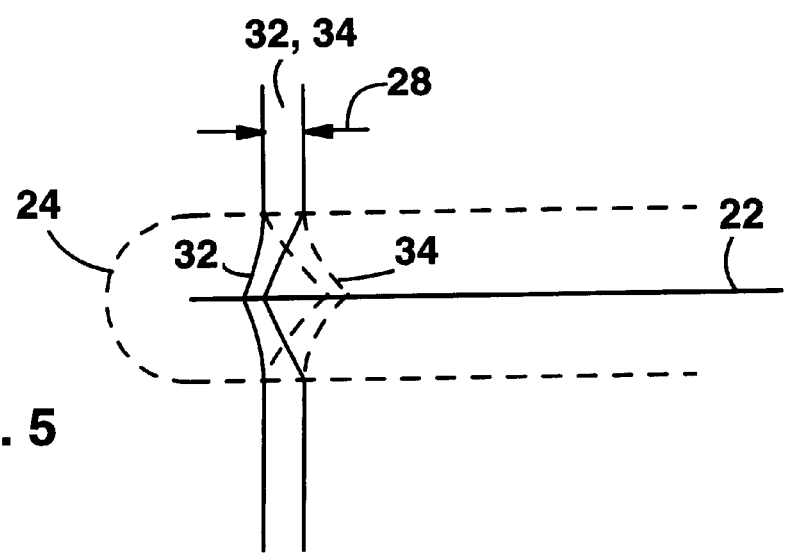
FIG. 5 illustrates method B of the present invention.

In method B of the present invention, the excitation pulse and first field gradient are applied, followed by the refocusing pulse and second field gradient. The second field gradient has an orientation which is opposite that of the first field gradient. Reversal of the gradient orientation produces excitation profile 32 and refocusing profile 34 which are shown in FIG. 5. It can be seen that the profiles 32, 34 are overlapping outside region 24, and not overlapping inside region 24. This difference in percentage overlap provides contrast between device 22 and tissues of patient 20. The amplitude of the first and second field gradients can be the same or different. If the field gradient amplitudes are the same, then the excitation RF pulse and the refocusing RF pulse should have the same bandwidth in order for the profiles 32, 34 to be overlapping outside region 24.

In method B, adjustment of contrast between device 22 and patient 20 is provided by adjusting the absolute difference in magnitude between the first field gradient and second field gradient. Since the first and second field gradients have opposite orientations, the difference is determined by adding the magnitudes of the gradients. A large difference between the first and second field gradients produces high contrast between the device 22 and patient.

After the above described steps in methods A and B are performed, a tilted readout field gradient is applied to the patient and device 22 to produce a magnetic resonance signal which provides imaging data. Methods for performing readout using tilted readout gradients (i.e. view angle tilting) are known in the art.

It is noted that contrast is provided by the present methods because only nuclear spins that are located within overlapping slices (i.e. within both slices 26 and 30 or slices 32 and 34) will contribute to the spin echo signal which is ultimately produced. Spins within region 24 are less likely to be within both slices (26 and 30, or 32 and 34). Therefore, a weaker magnetic resonance signal is received from within region 24 compared to outside region 24. The difference in spin echo signal strength provides a means for contrast control.

The above methods for contrast control are compatible with many well known methods of providing for tissue-tissue contrast. The present invention provides device-tissue contrast while placing no constraints on tissue-tissue contrast.

In method C, the excitation pulse and first field gradient are applied, followed by the refocusing pulse and second field gradient. The first and second field gradients have the same magnitudes. Therefore, the excitation profile and refocusing profile are fully overlapping even within region 24. A tilted readout gradient is applied to produce a spin echo signal 40, shown in FIG. 6. Due to the presence of the tilted readout gradient during the spin echo signal 40, a spin echo time 42 is not simultaneous with a peak 43 in the spin echo signal. The spin echo time is detected during a detection time 45. A centerpoint 47 of the detection time 45 is offset 46 compared to the spin echo time. The offset 46 results in a phase cancellation of spins within the region 24 due to the relatively large range of magnetic field strengths. The phase cancellation can be adjusted by varying the duration of the offset 46. A large offset results in more complete phase cancellation within region 24. Phase cancellation results in a weaker magnetic resonance signal being detected from region 24. Due to the large local magnetic field variations within region 24, even short offsets result in an increase in device contrast. For example, offsets within the range of about 500–1500 microseconds produce a wide range of contrasts. For large magnetic field variations within region 24, the offset 46 can be small and still provide a nominal amount of contrast; for small magnetic field variations within region 24, the offset 46 must be longer to achieve the same nominal amount of contrast. It is noted that it is preferable for the centerpoint 47 of the detection time to be simultaneous with the peak 43.

FIG. 7A shows a diagram which illustrates a conventional imaging method according to the prior art. Volume elements 50, 51 are located in a region of perturbed magnetic field (e.g. close to a magnetic susceptibility variation). Although volume elements 50, 51 are mechanically connected in physical space, they appear to be disconnected in an MRI image 54 due to the magnetic field perturbation. The MRI image is produced line by line in a readout direction 52 determined by a readout field gradient. FIG. 7B illustrates the method of view angle tilting according to the prior art. The readout gradient is tilted by an angle 0 53, thereby tilting the readout direction 52. The tilt 53 of the readout direction makes the volume elements appear connected (i.e. as they actually are), thereby eliminating the distortion which made the elements 50, 51 appear disconnected.

Figure 7C:
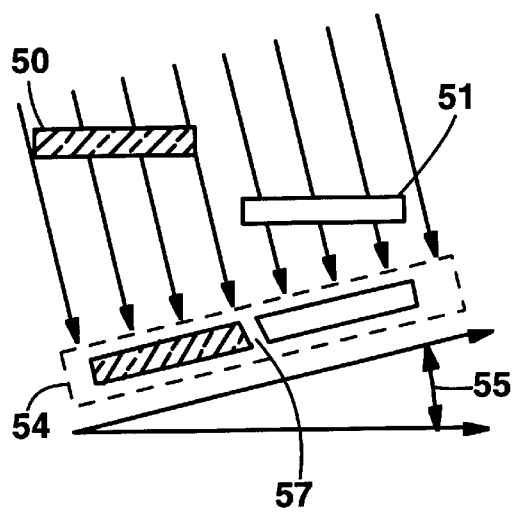
FIG. 7C illustrates method D of the present invention.

Method D of the present invention is illustrated in FIG. 7C. In the method of FIG. 7C, the readout gradient is tilted by an amount which does not fully correct for distortion caused by device 22. As a result, some device distortion is allowed to remain in the image. The tilt angle 55 is different from the angle 53 which would result in complete correction of the distortion. The volume elements 50, 51 appear to be disconnected 57 in the MRI image 54. The gap 57 provides contrast between volume elements 50, 51. Analogously, contrast is provided between tissue and device 22. This method allows the contrast of device 22 to be increased or decreased by varying the tilt angle 55.

Figure 8A:
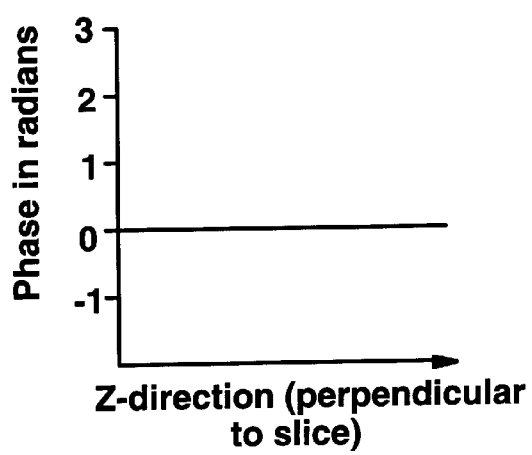
FIG. 8A is a chart showing a flat phase profile. The horizontal axis of the chart is perpendicular to the slice.

FIG. 8A shows a flat phase profile in a slice resulting from a conventional linear phase RF pulse applied in a region with a uniform magnetic field (i.e. far from device 22). The phase profile is plotted in a direction perpendicular to the slice. An excited slice with such a phase profile produces a large magnetic resonance echo signal.

Figure 8B:
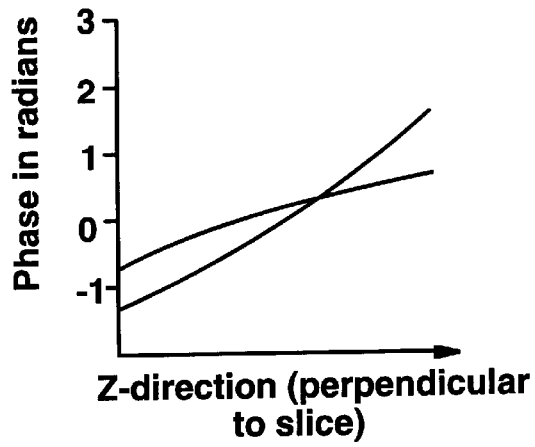
FIG. 8B is a chart showing a distorted phase profile.

FIG. 8B shows two examples of distorted phase profiles which result when a linear phase RF pulse is applied in region 24. The variations in magnetic field cause variations in the phase profile across the slice. The phase variations are generally approximately linear. A slice with such a distorted phase profile produces a negligible gradient echo signal in the vicinity of the device 22 due to a substantial dephasing of spins within region 24.

Figure 8C:
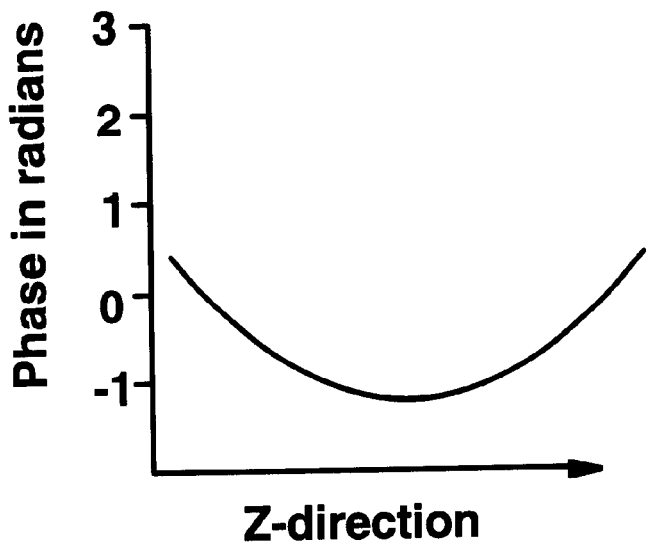
FIG. 8C is a chart showing a pure quadratic phase profile.

FIG. 8C shows a pure quadratic phase profile produced by a quadratic RF pulse applied in a region with a homogenous field (i.e. with no field gradient). The quadratic phase results in only partial phase cancellation across the slice. Therefore, a gradient echo signal can still be produced from a slice having a quadratic phase profile.

In method E of the present invention, a nonlinear phase excitation pulse and first field gradient are applied to excite a slice. Then, an inverted field gradient is applied so that a gradient echo is produced. The inverted field gradient has an orientation which is opposite of the first field gradient. Then, a tilted readout gradient is applied at an angle selected to remove the distortion caused by the magnetic susceptibility variation (i.e. view angle tilting). The nonlinear phase characteristic of the excitation pulse results in the slice having a nonlinear phase profile.

Figure 8D:
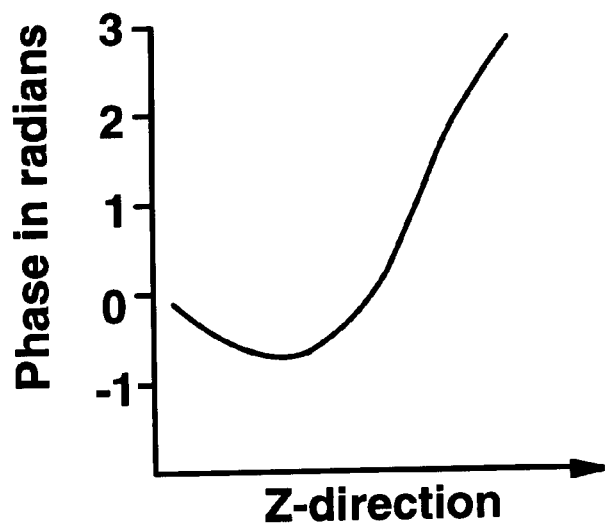
FIG. 8D is a chart showing a distorted+quadratic phase profile according to method E.

When quadratic phase RF pulses are used in the presence of a distorted field, the resultant phase profile has the sum of the distorted phase (shown in FIG. 8B) and quadratic phase (shown in FIG. 8C). A resultant distorted+quadratic phase profile is shown in FIG. 8D. The addition of the phase distortion of FIG. 8B to the quadratic phase profile results in a change in the amount of phase coherence and therefore changes the signal strength from region 24. Device contrast is adjusted by altering the magnitude of the quadratic component of the RF excitation pulse.

Figure 9A:
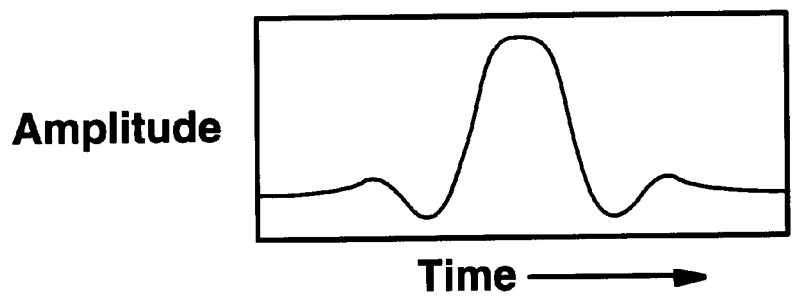
FIGS. 9A–9B (Prior Art) show amplitude and phase profile of a flat phase RF pulse.
Figure 9B:
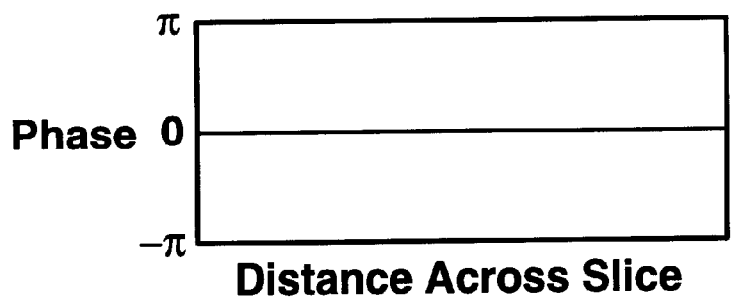
Figure 9C:
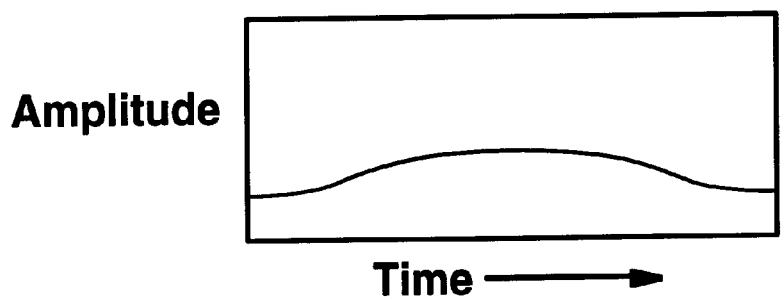
FIGS. 9C–9D show amplitude and phase profile of a quadratic phase RF pulse according to method E.
Figure 9D:
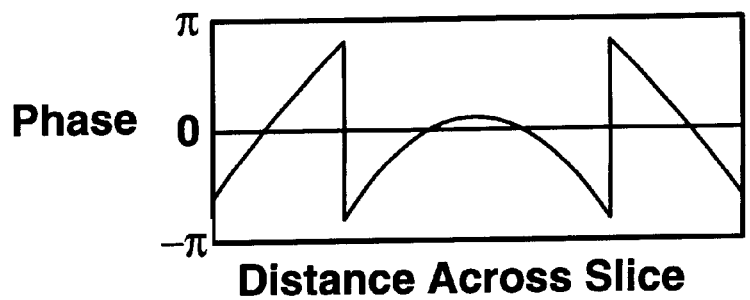

FIGS. 9A and 9B show the amplitude and phase of a conventional linear RF sinc pulse. FIGS. 9C and 9D show the amplitude and phase of a quadratic phase RF pulse according to a preferred embodiment of method E.

Figure 10:
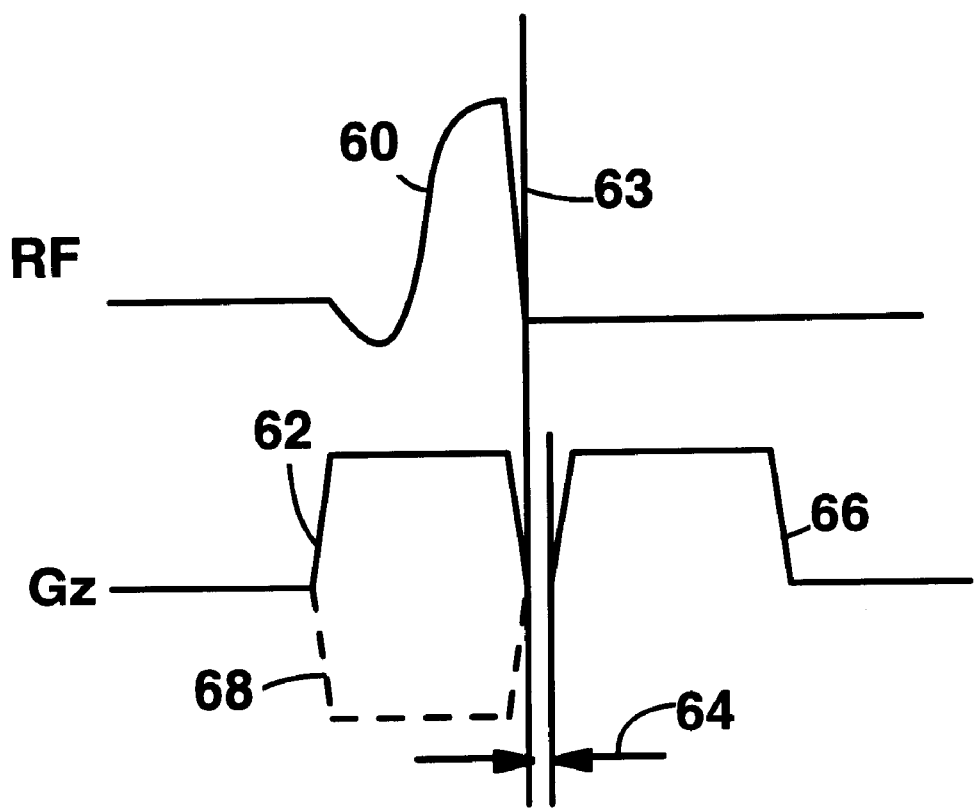
FIG. 10 is a pulse sequence diagram illustrating method F.

FIG. 10 shows a pulse sequence used in method F of the present invention. A RF half pulse 60 is applied simultaneous with a first field gradient 62, thereby selecting a slice. At time 63, the RF half pulse and gradient are rapidly turned completely off. Rapidly turning off the RF pulse 60 and gradient 62 at time 63 allows a signal to be detected from the on-resonance spins within the selected slice. Interval time 66 is required to shut off the RF transmitter and turn on a receiver. Interval time 66 should be as short as possible (e.g. 200 microseconds). After the interval time 64, a tilted readout gradient 66 is applied. The tilted readout gradient produces a magnetic resonance signal from slice selected by pulse 60 and gradient 62. Since spins within region 24 dephase at a faster rate than outside region 24, the magnetic resonance signal is weaker in region 24 than outside region 24. Increasing the interval time disproportionately reduces the signal strength from within region 24 more than outside region. The use of half pulses reduces the echo time, which reduces intervoxel dephasing of spins and thus reduces signal loss within region 24. A decrease in signal loss allows adjustment of device contrast by simply increasing or decreasing the interval time 66. In a typical application, many RF pulses can be used sequentially. Each half pulse has the same RF waveform, but with the gradient waveform inverted 68 (i.e. the gradient orientation reversed) in every other pulse. The use of RF half pulses for measuring on-resonance (i.e. resonant with RF pulse) spins is disclosed in U.S. Pat. No. 5,150,053 to Pauly.

The present invention comprises the combination of view angle tilting with any one of methods A–F. Thus it provides a number of ways in which to remove device distortion while adjusting device contrast, all of which do not significantly affect tissue imaging. The present invention therefore provides methods of producing MRI images that are optimized in both device/tissue contrast and tissue/tissue contrast. This provides many benefits including aiding in the accurate positioning of devices within a patient.

It will be clear to one skilled in the art that the above embodiment may be altered in many ways without departing from the scope of the invention. For example, all types of interventional devices fabricated from a broad range of materials can be imaged using the described method. Accordingly, the scope of the invention should be determined by the following claims and their legal equivalents.

What is claimed is:

1. A method for view-angle tilt magnetic resonance imaging of an object having a localized magnetic susceptibility variation, the method comprising the steps of:
   a) applying to the object an excitation RF pulse simultaneous with a first field gradient to select a slice and determine an excitation profile;
   b) applying to the object a refocusing RF pulse simultaneous with a second field gradient to refocus the slice and determine a refocusing profile, wherein the refocusing RF pulse bandwidth is selected and the second field gradient magnitude is selected such that the excitation profile and the refocusing profile are substantially overlapping in a region outside the magnetic susceptibility variation;
   c) applying to the object a tilted readout field gradient such that a spin echo signal is produced from a volume of interest within a region of the magnetic susceptibility variation; and d) capturing the spin echo signal during a detection time;

wherein the first field gradient, the second field gradient, and the detection time are selected to more completely refocus nuclear spins in the region outside the magnetic susceptibility variation, thereby providing magnetic susceptibility contrast with respect to the region of the magnetic susceptibility variation.

2. The method of claim 1 wherein the second field gradient has an amplitude different from the first field gradient, and wherein the refocusing RF pulse has a different bandwidth compared to the excitation RF pulse whereby the excitation profile and the refocusing profile are partially not overlapping in the region of the magnetic susceptibility variation, thereby providing magnetic susceptibility contrast in the region of the magnetic susceptibility variation.

3. The method of claim 2 further comprising the step of varying an amplitude difference between the first field gradient and the second field gradient to provide a desired amount of magnetic susceptibility contrast.

4. The method of claim 1 wherein the excitation profile and the refocusing profile have the same thickness and location outside the magnetic susceptibility variation.

5. The method of claim 1 wherein additional refocusing RF pulses, second field gradients, and tilted readout gradients are applied to comprise a rapid acquisition and relaxation enhancement sequence.

6. The method of claim 1 wherein the second field gradient has a direction opposite from the first field gradient, whereby the excitation profile and the refocusing profile are partially not overlapping in the region of the magnetic susceptibility variation, thereby providing magnetic susceptibility contrast in the region of the magnetic susceptibility variation.

7. The method of claim 6 further comprising the step of varying an amplitude difference between the first field gradient and the second field gradient to provide a desired amount of magnetic susceptibility contrast.

8. The method of claim 1 wherein the detection time is offset with respect to the echo time thereby providing magnetic susceptibility contrast in the region of the magnetic susceptibility variation.

9. The method of claim 8 further comprising the step of varying the offset to provide a desired amount of magnetic susceptibility contrast.

* * * * *